US007459806B2

(12) United States Patent
Wolf et al.

(10) Patent No.: US 7,459,806 B2
(45) Date of Patent: Dec. 2, 2008

(54) HIGH VOLTAGE MAGNETIC COMPRESSION MODULATOR

(75) Inventors: Miki Wolf, Petah Tikva (IL); Alex Pokryvailo, Tal Shachar (IL); Yefim Yankelevich, Rehovot (IL); Eli Abramzon, Beer Sheva (IL)

(73) Assignee: Soreq Nuclear Research Center, Nahal Soreq, Yavne (IL)

( * ) Notice: Subject to any disclaimer, the term of this patent is extended or adjusted under 35 U.S.C. 154(b) by 0 days.

(21) Appl. No.: 10/559,849

(22) PCT Filed: Jun. 9, 2004

(86) PCT No.: PCT/IL2004/000488

§ 371 (c)(1),
(2), (4) Date: Dec. 7, 2005

(87) PCT Pub. No.: WO2004/109915

PCT Pub. Date: Dec. 16, 2004

(65) Prior Publication Data

US 2006/0131964 A1    Jun. 22, 2006

(51) Int. Cl.
*H02M 5/10* (2006.01)
(52) U.S. Cl. ...................................................... 307/149
(58) Field of Classification Search ................ 307/419, 307/106
See application file for complete search history.

(56) References Cited

U.S. PATENT DOCUMENTS

| 4,612,455 | A | 9/1986 | Wiener et al. |
| 6,362,604 | B1 * | 3/2002 | Cravey ........................ 323/241 |
| 6,389,049 | B2 * | 5/2002 | Yoshida et al. ............ 372/38.02 |
| 6,999,492 | B2 * | 2/2006 | von Bergmann et al. ...... 372/81 |
| 2002/0003820 | A1 | 1/2002 | Yoshida et al. |

OTHER PUBLICATIONS

Kotov Y A et al. Institute of Electreical and Electronics Engineers."A Novel Nanosecond Semiconductor Opening Switch for Megavolt Repetitive Pulsed Power Technologies Experiment and Applications", Digest of Technical Papers of the International Pulse Power Conference Albuerque, NM, Jun. 21-23, 1993 New York, IEEE, US, vol. 1 . Conf. 9.21 Jun. 1993.*

* cited by examiner

*Primary Examiner*—Michael J Sherry
*Assistant Examiner*—Michael Rutland Wallis
(74) *Attorney, Agent, or Firm*—Dekel Patent Ltd.; David Klein

(57) ABSTRACT

A high voltage magnetic compression modulator including a low-voltage part including an energy source connected to a primary winding of a pulsed transformer, and a high-voltage part including a secondary winding of the pulsed transformer connected to a capacitor, the capacitor being connected to a magnetic switch, the magnetic switch being connected to a load, characterized in that a unidirectional low-impedance path for the charge of the capacitor is connected in parallel to the load, and wherein said low impedance path includes a freewheeling diode.

13 Claims, 3 Drawing Sheets

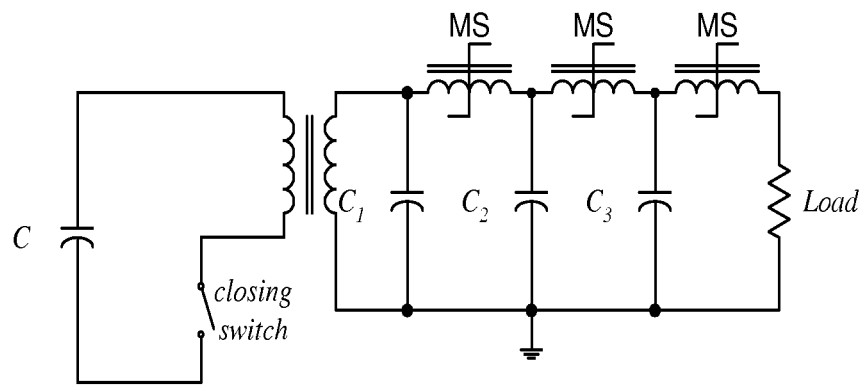
Fig. 1 – PRIOR ART
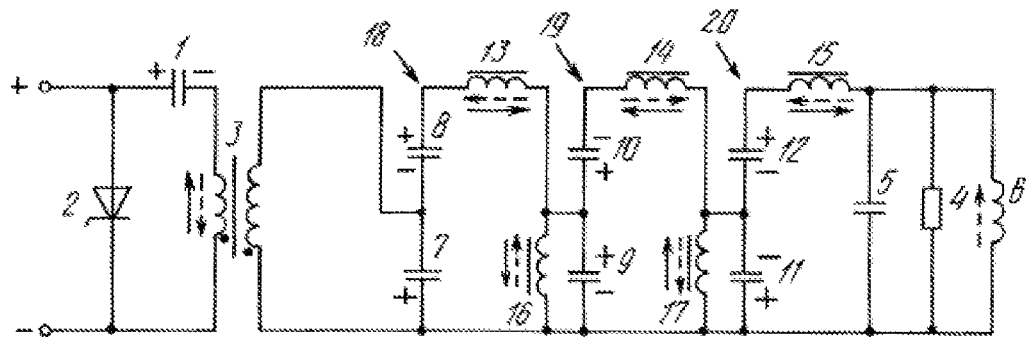
Fig. 2 – PRIOR ART
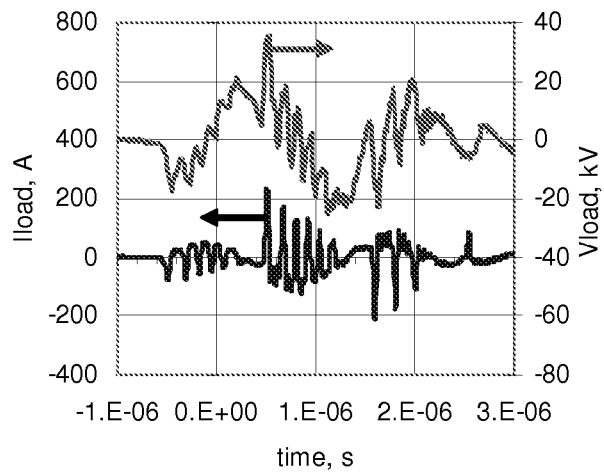
Fig. 3 – PRIOR ART

HIGH VOLTAGE MAGNETIC COMPRESSION MODULATOR

FIELD OF THE INVENTION

This invention is related to the generation of high-voltage nanosecond pulses at high repetition rate and may be used in laser technology, e.g., for feeding gas and metal vapor lasers, driving corona discharge in pollution control applications, for generation of charged particle beams, etc.

BACKGROUND OF THE INVENTION

HV nanosecond pulse generation technology is based primarily on the capacitive energy storage and closing switches. The simplest example is a capacitor shorted onto a discharge load gap by a spark gap. Although abundant in laboratory use, these basic capacitive systems do not allow pulse shaping, are characterized by a ringing uncontrollable discharge and possess a short lifetime.

Capacitive sources with magnetic compression shown schematically in FIG. 1 represent advanced technology. (See e.g., Oh J. S., Cho M. H., Ko I. S., Namkung W. and Jang J. H. "Operational Characteristics of 30 kW Average MPC Modulator for Plasma DeNO$_x$/DeSO$_x$ System". *Proc. of 11$^{th}$ IEEE Int. Pulsed Power Conf., Baltimore*, Jun. 29-Jul. 2, 1997, pp. 1091-1096, and Druckmann I. and Smilanski I. "Operation of Two-Copper Lasers by a Single Magnetic Modulator". *Proc. of 11$^{th}$ IEEE Int. Pulsed Power Conf., Baltimore*, Jun. 29-Jul. 2, 1997.) They can be realized with all-solid state switches having microsecond closing times, although most pulsers are thyratron-based. Magnetic switches (MS) compress a wide microsecond pulse to a desired width. Pulsers with all-solid state semiconductor and magnetic switches offer long life and have high reliability.

A serious shortcoming of pulsers like the one depicted in FIG. 1 is in the necessity of remagnetization of the cores of the magnetic switches. Another deficiency is the drop in the output voltage, when the transformer pulse is compressed during the energy transfer across the compression stages.

Another magnetic compression system is described in Rukin S. N. "Device for pulse magnetic compression", RF Inventor's Certificate No. 2 089 042, Byul. Izobr. N. 24, 27 Aug. 1997, p. 426, filing date 29 Mar. 1993, and shown schematically in FIG. 2. This pulser, which is essentially a well-known Fitch circuit (see, e.g., Bazelyan E. M. and Raizer Yu. P. "Spark Discharge". CRC Press, NY, 1998, 294 pp., p. 97), provides voltage multiplication and does not require costly remagnetization techniques. It operates as follows. When switch 2 closes, capacitor 1 discharges and through transformer 3 charges capacitors 7 and 8 to the shown polarities. Upon the saturation of the transformer 3 core, capacitor 7 recharges to the opposite polarity and the voltage across capacitors 7 and 8 doubles. At this moment, the core of magnetic switch 13 saturates, and the voltage is applied to magnetic switch 16 and to capacitors 9 and 10. The described process repeats itself through the number of compression stages. Similarly to the voltage doubling in the first compression stage, upon the magnetic switch 16 closure, capacitor 9 recharges to the opposite polarity, and the voltage across capacitors 9 and 10 doubles, etc. The charge path for capacitor 12 is provided by the load 4, its parasitic capacitance 5 and auxiliary inductor 6. Finally, when magnetic switch 15 closes, capacitors 11 and 12 discharge onto load 4.

The shortcoming of the described device is that in the case of a gas discharge load that is an open circuit at low voltage, e.g., a corona gap, there is no adequate path for C12 charge, and additionally, the load capacitance 5 together with inductor 6 form a resonance subcircuit, which instead of a unipolar pulse, generates ringing bipolar pulses. An accompanying disadvantage of these phenomena is a low energy efficiency of the said topology. This is illustrated by the waveforms of load voltage and current (FIG. 3) in the case of a corona discharge load (see Pokryvailo, A., Yankelevich, Y., Wolf, M., Abramzon, E., Shviro., E., Wald, S., and Wellemann, A., "A 1KW Pulsed Corona System for Pollution Control Applications", *Proc. 14$^{th}$ IEEE Int. Conf on Pulsed Power*, Dallas, 15-18 Jun. 2003, pp. 225-228).

SUMMARY OF THE INVENTION

The present invention seeks to provide a novel high voltage magnetic compression modulator, as is described more in detail hereinbelow.

There is thus provided in accordance with an embodiment of the present invention a high voltage magnetic compression modulator including a low-voltage part including an energy source (e.g., a charger) connected to a primary (low-voltage) winding of a pulsed transformer, and a high-voltage part including a secondary winding of the pulsed transformer connected to a capacitor, the capacitor being connected to a magnetic switch, the magnetic switch being connected to a load, characterized in that unidirectional low-impedance path (e.g., by means of a freewheeling diode) for the charge of the capacitor is connected in parallel to the load.

In one non-limiting embodiment of the invention, the low-voltage part includes a charger whose positive terminal is connected to a first terminal of a storage capacitor and to a first terminal of a fast high-current commutator, and whose negative terminal is connected to a second terminal of the commutator and to a first terminal of a low-voltage winding of a step-up pulse transformer, the second terminal of the low-voltage winding being connected to the second terminal of the storage capacitor, and the high-voltage part is formed by the high-voltage transformer wound on a ferromagnetic core whose secondary winding is connected in parallel to a first capacitor and by a first of its terminals to a first terminal of a second capacitor, and by a second of its terminals to a first terminal of a magnetic switch, a second terminal of the magnetic switch being connected to a first terminal of a load, a second terminal of the secondary winding being connected to a second terminal of the load.

The fast high-current commutator may include a thyristor, and the ferromagnetic core may have a rectangular magnetization curve.

In one non-limiting embodiment of the invention, N additional compression stages may be connected between the magnetic switch and the load and diode, each stage including an additional first magnetic switch, whose winding is connected in parallel to the first capacitor of this stage and by the first of its terminals to the first terminal of the second capacitor of this stage, whose second terminal is connected to the first terminal of the winding of second additional magnetic switch of this stage, the second terminal of second magnetic switch winding being connected to the first terminal of the first magnetic switch of the following stage, the second terminal of the winding of the first magnetic switch being connected to the second terminal of the load and to the diode, and whose second terminals are connected to the second terminal of the second magnetic switch of the last compression stage.

Any one or all of the magnetic switches may be implemented as a high-voltage transformer wound on a ferromagnetic core having a rectangular magnetization curve.

BRIEF DESCRIPTION OF THE DRAWINGS

FIG. 1 is schematics illustrative of a conventional magnetic compression system.

FIG. 2 is schematics illustrative of a prior art system.

FIG. 3 shows experimental timing diagrams of a prior art system, having one compression stage, in the case of a corona load.

DESCRIPTION OF EMBODIMENTS OF THE INVENTION

The present invention seeks to provide an efficient simple system for driving pulsed loads in the nanosecond range, such as gas and metal vapor lasers, e.g., excimer lasers, corona discharge, pulsed accelerators, etc. The invention may be used to generate clean unipolar HV pulses.

Figure 4:
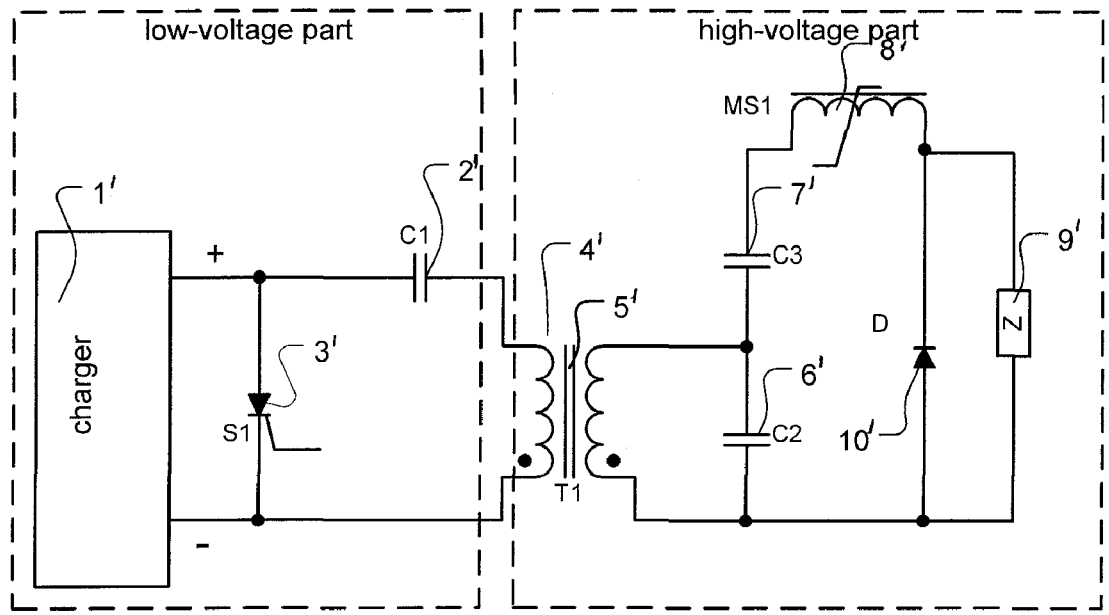
FIG. 4 is one preferred embodiment of a high voltage magnetic compression modulator according to the invention.
Figure 5:
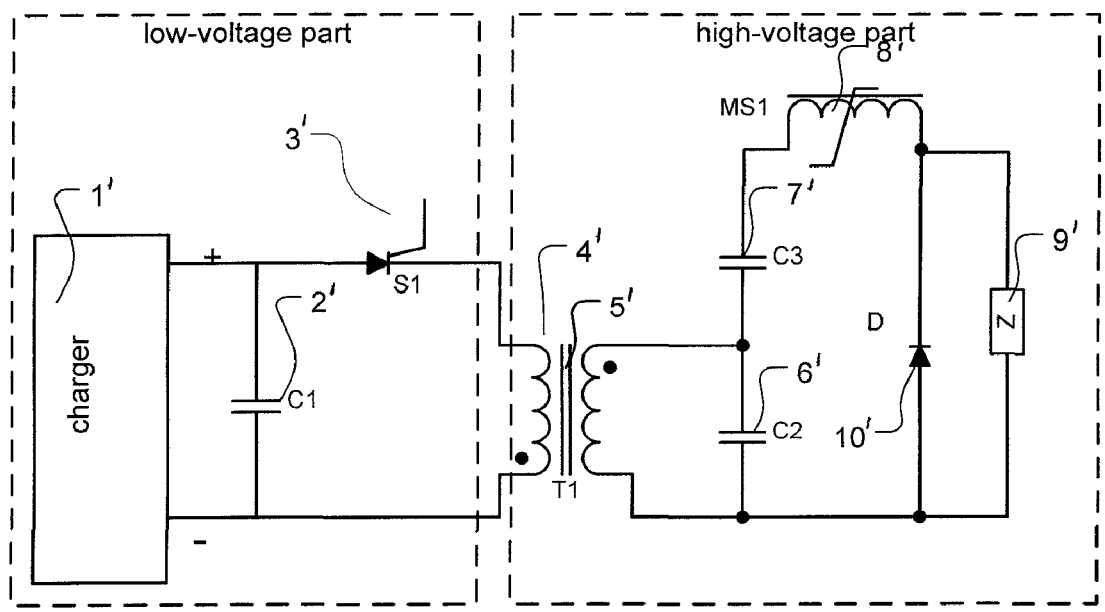
FIG. 5 is another preferred embodiment of a high voltage magnetic compression modulator according to the invention.
Figure 6:
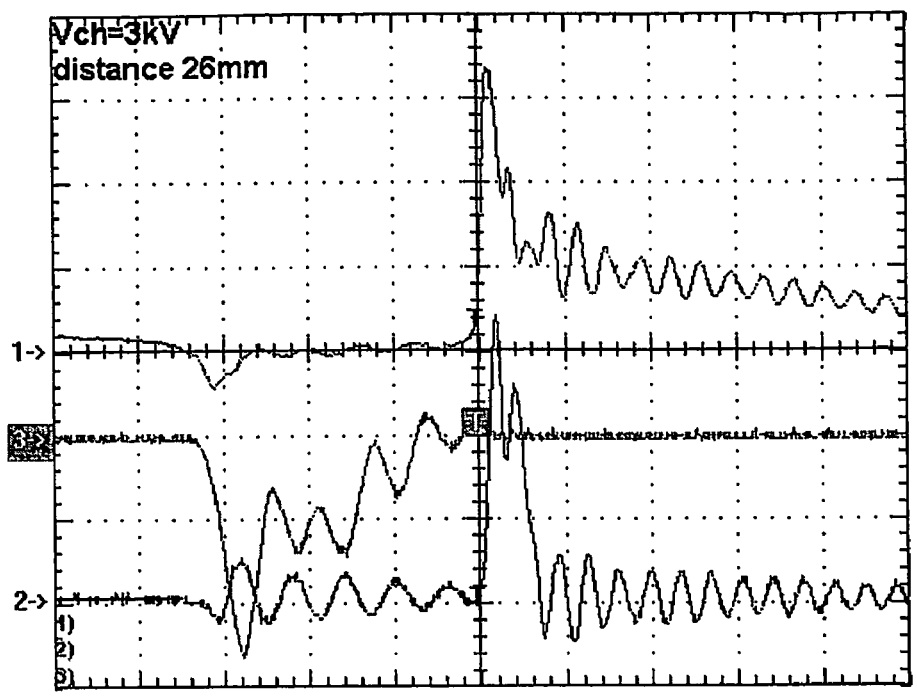
FIG. 6 shows experimental timing diagrams of preferred embodiment in the case of a corona load.

A preferred embodiment of the invention is shown in FIG. 4 (and an alternative embodiment in FIG. 5). It may be based on the system of FIG. 2, and for the sake of clarity, only one compression stage is shown. The device may comprise a low-voltage part formed by an energy source, such as a charger (1' in the drawing), a storage capacitor C1 (2' in the drawing) and a fast high-current commutator S1 (3' in the drawing), such as a thyristor. The high-voltage part may be formed by a pulsed high-voltage transformer T1 (4' in the drawing) wound on a ferromagnetic core (5' in the drawing) having preferably a rectangular magnetization curve, two capacitors C2 (6' in the drawing), C3 (7' in the drawing), magnetic switch MS1 (8' in the drawing), load Z (9' in the drawing), and a unidirectional semiconductor element, such as a freewheeling diode D (10' in the drawing). The device according to this invention functions similarly to that shown in FIG. 1, with an important exception, being that a low-impedance unidirectional path such as through the freewheeling diode D, is provided for the charge of capacitor C3. This may be especially important in the case of a high-impedance load. The time delay of magnetic switch MS1 may be selected to be sufficiently large in order to enable diode D to recover after conduction. In practically important cases, as was shown experimentally, this condition is fulfilled automatically, and then the freewheeling diode D may be a simple standard fast-recovery diode. Remarkably stable unipolar pulses are generated at the output. This is illustrated by the waveforms of load voltage and current (FIG. 6) in the case of the corona discharge load at similar experimental conditions as in FIG. 3, where no freewheeling diode was used. The diodes' forward current (seen as the negative swing in FIG. 6) falls to zero during the C3 charge before the appearance of the reverse voltage even in the whole range of the compressor operation; hence, no appreciable diode reverse current flows, and as a consequence, standard inexpensive fast recovery diodes may be used.

Contrary to known art, the circuit is exceptionally insensitive to the drift of circuit parameters, and inexpensive ceramic capacitors having large temperature drift may be used. As mentioned above, this embodiment may also dramatically increase the energy transfer efficiency from capacitor C1 to the load; the efficiency was above 50% with corona load compared to that of 15% without freewheeling diode D.

Figure 7:
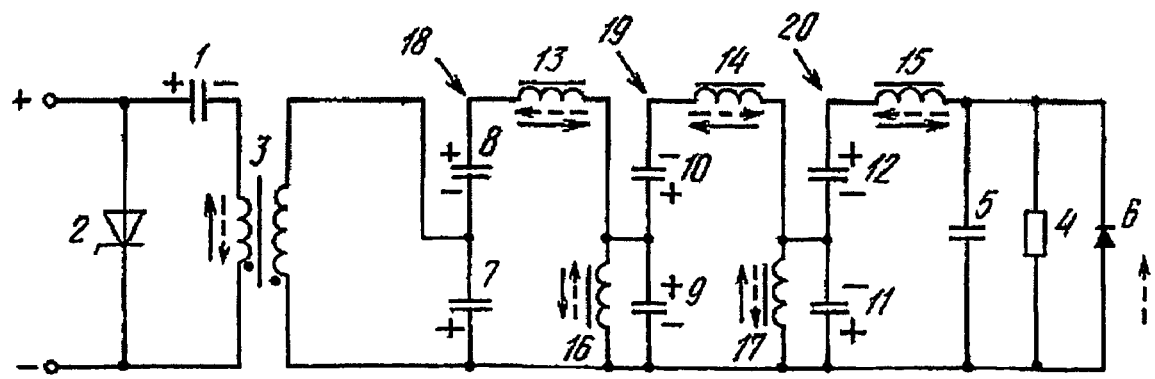
FIG. 7 is another preferred embodiment of high voltage magnetic compression modulator according to the invention.

Another preferred embodiment of high voltage magnetic compression modulator according to the invention is shown in FIG. 7. Its only difference from the previous embodiment FIG. 4 is in the number of the compression stages. With several stages, higher voltage pulses with sharper rise are generated; otherwise, the device functions identically to device of FIG. 4. As magnetic switches, saturable transformers can be used.

The invention claimed is:

1. A high voltage magnetic compression modulator comprising:
    a low-voltage part comprising an energy source connected to a primary winding of a pulsed transformer; and
    a high-voltage part comprising a secondary winding of said pulsed transformer connected in parallel to a first capacitor and by a first of the first capacitors terminals to a first terminal of a second capacitor, and by a second of the second capacitors terminals to a first terminal of a magnetic switch, a second terminal of the magnetic switch being connected to a first terminal of a load, a second terminal of said secondary winding being connected to a second terminal of said load;
    wherein said second magnetic switch is distanced separate from said capacitor and further comprising a unidirectional low-impedance path by which said second capacitors is charged through a freewheeling diode connected in parallel to said load.

2. The high voltage magnetic compression modulator according to claim 1, wherein the low-voltage part further comprises a storage capacitor and a fast high-current commutator, all connected in series in a loop with said primary winding of said pulsed transformer, and wherein said energy source comprises a capacitor charger.

3. The high voltage magnetic compression modulator according to claim 2, wherein said charger is connected to the storage capacitor and to the fast high-current commutator.

4. The high voltage magnetic compression modulator according to claim 1, wherein said pulsed transformer is wound on a ferromagnetic core.

5. The high voltage magnetic compression modulator according to claim 1, wherein said magnetic switch is connected in series with said capacitor.

6. A high voltage magnetic compression modulator comprising:
    a low-voltage part comprising a charger with a first terminal connected to a first terminal of a storage capacitor and to a first terminal of a fast high-current commutator, and with a second terminal connected to a second terminal of said commutator and to a first terminal of a low-voltage winding of a pulsed transformer, the second terminal of said low-voltage winding being connected to the second terminal of said storage capacitor; and
    a high-voltage part formed by said high-voltage transformer wound on a ferromagnetic core whose secondary winding is connected in parallel to a first capacitor wherein a first terminal of said first capacitor is connected to a first terminal of a second capacitor, and a second terminal of said second capacitor is connected to a first terminal of a magnetic switch, a second terminal of the magnetic switch being connected to a first terminal of a load, a second terminal of said secondary winding being connected to a second terminal of said load;

wherein said magnetic switch is distanced from said second capacitor and further comprising a low-impedance path by which said second capacitor is charged through a freewheeling diode connected in parallel to said load.

7. The high voltage magnetic compression modulator according to claim 6, wherein said charger first terminal is a positive terminal and said charger second terminal is a negative terminal.

8. The high voltage magnetic compression modulator according to claim 6, wherein said charger first terminal is a negative terminal and said charger second terminal is a positive terminal.

9. The high voltage magnetic compression modulator according to claim 6, wherein said fast high-current commutator comprises a thyristor.

10. The high voltage magnetic compression modulator according to claim 6, wherein said ferromagnetic core has a rectangular magnetization curve.

11. The high voltage magnetic compression modulator according to claim 6, further comprising N additional compression stages connected between said magnetic switch and said load and diode, each stage comprising an additional first magnetic switch, whose winding is connected in parallel to the first capacitor of this stage and by the first of its terminals to the first terminal of the second capacitor of this stage, whose second terminal is connected to the first terminal of the winding of second additional magnetic switch of this stage, the second terminal of second magnetic switch winding being connected to the first terminal of the first magnetic switch of the following stage, the second terminal of said winding of said first magnetic switch being connected to the second terminal of said load and to said diode, whose second terminals are connected to the second terminal of the second magnetic switch of the last compression stage.

12. The high voltage magnetic compression modulator according to claim 11, wherein at least one of said first magnetic switches is implemented as a high-voltage transformer wound on a ferromagnetic core having a rectangular magnetization curve.

13. The high voltage magnetic compression modulator according to claim 6, wherein said magnetic switch is connected in series with said second capacitor.

* * * * *